(12) United States Patent
Guo et al.

(10) Patent No.: US 8,674,393 B2
(45) Date of Patent: Mar. 18, 2014

(54) SUBSTRATE STRUCTURE AND FABRICATION THEREOF, AND LIGHT EMITTING DIODE DEVICES FABRICATED FROM THE SAME

(75) Inventors: Yih-Der Guo, Hsinchu (TW); Chu-Li Chao, Hsinchu (TW); Yen-Hsiang Fang, Taipei County (TW); Ruey-Chyn Yeh, Hsinchu County (TW); Kun-Fong Lin, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 509 days.

(21) Appl. No.: 12/975,271

(22) Filed: Dec. 21, 2010

(65) Prior Publication Data

US 2012/0153338 A1 Jun. 21, 2012

(51) Int. Cl.
*H01L 33/00* (2010.01)
(52) U.S. Cl.
USPC ............................................. 257/99; 257/103
(58) Field of Classification Search
USPC .............................................. 257/99, 76, 103
See application file for complete search history.

(56) References Cited

U.S. PATENT DOCUMENTS

| | | | |
|---|---|---|---|
| 6,582,986 B2 | 6/2003 | Kong et al. | |
| 6,713,845 B2 | 3/2004 | Hayashi et al. | |
| 6,720,586 B1 | 4/2004 | Kidoguchi et al. | |
| 6,911,351 B2 | 6/2005 | Kidoguchi et al. | |
| 7,081,632 B2* | 7/2006 | Hosoi et al. | 250/484.4 |
| 7,109,530 B2 | 9/2006 | Hayashi et al. | |
| 7,279,344 B2 | 10/2007 | Hayashi et al. | |
| 7,399,687 B2 | 7/2008 | Hiramatsu et al. | |
| 7,682,944 B2 | 3/2010 | Brandes et al. | |
| 7,704,860 B2 | 4/2010 | Shimamoto et al. | |
| 7,727,332 B2 | 6/2010 | Habel et al. | |
| 2003/0207125 A1* | 11/2003 | Sunakawa et al. | 428/428 |
| 2008/0054292 A1* | 3/2008 | Guo et al. | 257/103 |
| 2008/0272378 A1* | 11/2008 | Guo et al. | 257/76 |
| 2009/0274883 A1 | 11/2009 | Liu et al. | |
| 2010/0090312 A1 | 4/2010 | Guo et al. | |

OTHER PUBLICATIONS

Chao et al., "Freestanding high quality GaN substrate by associated GaN nanorods self-separated hydride vapor-phase epitaxy", Applied Physics Letters 95, 051905-1~051905-3 (Aug. 4, 2009).
Lipski et al., "Fabrication of freestanding 2'-GaN wafers by hydride vapour phase epitaxy and self-separation during cooldown", Physica Status Solidi A 207, No. 6, pp. 1287-1291 (May 17, 2010).
Lee et al., "Microstructural Analysis of Void Formation Due to a NH4CI Layer for Self-Separation of GaN Thick Films", Crystal Growth & Design vol. 9, No. 6, pp. 2877-2880 (Apr. 8, 2009).
Hennig et al., "Freestanding 2-in GaN layers using lateral overgrowth with HVPE", Journal of Crystal Growth 310, pp. 911-915 (Mar. 1, 2008).
Fujito et al., "Bulk GaN crystals grown by HVPE", Journal of Crystal Growth, 311, pp. 3011-3014 (Mar. 1, 2009).

\* cited by examiner

*Primary Examiner* — Jarrett Stark
*Assistant Examiner* — John M Parker
(74) *Attorney, Agent, or Firm* — Jianq Chyun IP Office

(57) ABSTRACT

A substrate structure is described, including a starting substrate, crystal piers on the starting substrate, and a mask layer. The mask layer covers an upper portion of the sidewall of each crystal pier, is connected between the crystal piers at its bottom, and is separated from the starting substrate by an empty space between the crystal piers. An epitaxial substrate structure is also described, which can be formed by growing an epitaxial layer over the above substrate structure form the crystal piers. The crystal piers may be broken after the epitaxial layer is grown.

17 Claims, 4 Drawing Sheets

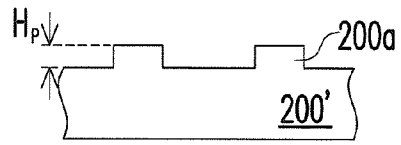
FIG. 2A  FIG. 2A'
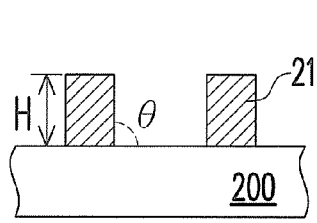
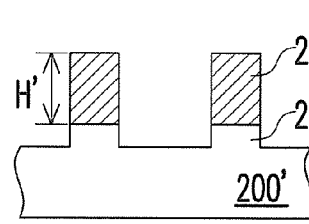
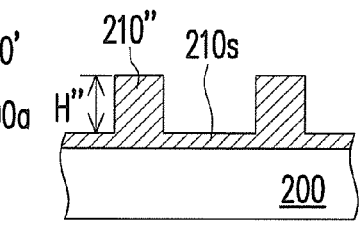
FIG. 2B  FIG. 2B'  FIG. 2B"
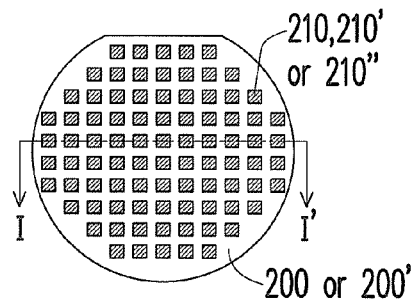
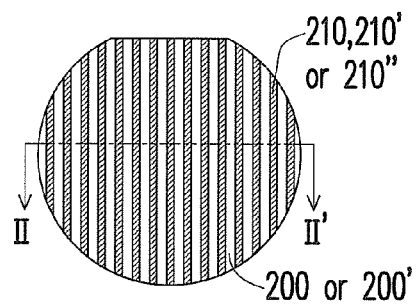
FIG. 2B-1  FIG. 2B-2
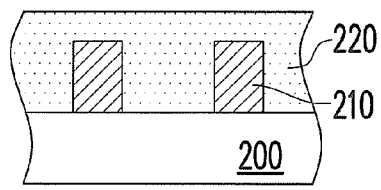
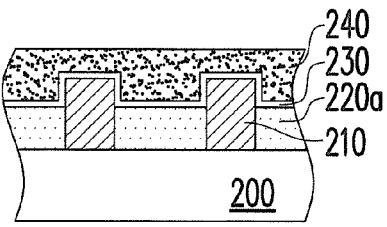
FIG. 2C  FIG. 2D

SUBSTRATE STRUCTURE AND FABRICATION THEREOF, AND LIGHT EMITTING DIODE DEVICES FABRICATED FROM THE SAME

BACKGROUND

1. Technical Field

This disclosure relates to a substrate structure, a method of fabricating the same, and light-emitting diode devices fabricated from the same.

2. Related Art

A type of homo-substrate includes an air-bridge structure where an epitaxial film is formed from and supported by crystal piers of the same nitride semiconductor material disposed on a hetero-substrate, as described in US 2008/0272378. FIGS. 1A and 1B/B' illustrate a method of fabricating such a substrate in the prior art.

Referring to FIG. 1A, a starting substrate 100 having thereon an array of crystal piers 110 is provided, and a mask layer 120 is formed on entire sidewalls of the crystal piers 110 and on the starting substrate 100 between the crystal piers 110, exposing the top surfaces 112 of all the crystal piers 110. The crystal piers 110 can be formed by forming an epitaxy layer on the starting substrate 100 and then patterning the same.

Referring to FIG. 1B, an epitaxy process is performed with hydride vapor-phase epitaxy (HVPE) or metallo-organic chemical vapor deposition (MOCVD) to grow an epitaxial layer 140 of the same material from the top surfaces 112 of the crystal piers 110, during which crystal grains firstly grow upward from the top surfaces 112 only due to the masking of the mask layer 120 and then grow upward and laterally to coalesce into a single layer as indicated by the dash lines 142, and the single layer continues to grow upward into a sufficiently thick epitaxial layer. Thereafter, the crystal piers 110 may be broken to provide an epitaxial substrate without a starting substrate.

As shown in FIG. 1B, sometimes polycrystalline nuclei are randomly deposited in some gaps 130 between the crystal piers 110 before the coalescence of the crystal grains and grow into polycrystalline grains 144 that fills up the gaps 130 or even makes the required layer 140 have polycrystals, as described in U.S. Pat. No. 6,582,986.

As shown in FIG. 1B', some crystal grains may not only grow upward and laterally as indicated by the arrows 146 but also grow downward as indicated by the arrow 148 before the coalescence, due to the characteristics of the HVPE or MOCVD. Thus, some gaps 130 between the epitaxial layer 140 and the substrate 100 get too small or even vanish.

In addition, since the sidewalls of the crystal piers 110 are entirely covered by the mask layer 120 that usually includes a dielectric material being hard and having no cleavage plane, the crystal piers 110 are difficult to break so that an epitaxial substrate without a starting substrate is difficult to obtain.

SUMMARY

Embodiments disclosed herein may provide a method of fabricating a substrate structure includes the following steps. A starting substrate is provided. A plurality of crystal piers is formed over the starting substrate. A mask layer is foci led over the starting substrate, wherein the mask layer covers an upper portion of the sidewall of each crystal pier, is connected between the crystal piers at its bottom, and is separated from the starting substrate by an empty space between the crystal piers.

Embodiments disclosed herein may provide a substrate structure includes a starting substrate, a plurality of crystal piers over the starting substrate, and a mask layer that covers an upper portion of a sidewall of each crystal pier, is connected between the crystal piers at its bottom, and is separated from the starting substrate by an empty space between the crystal piers.

Embodiments disclosed herein may provide an epitaxial substrate structure includes an epitaxial layer, a plurality of crystal piers, and a mask layer. The crystal piers are on the bottom surface of the epitaxial layer and have the same material of the epitaxial layer. The mask layer covers an upper portion of the sidewall of each crystal pier, and is connected between the crystal piers at its bottom.

The light-emitting diode device according to an embodiment of this disclosure includes the above epitaxial substrate structure without a starting substrate, a light-emitting epitaxial structure formed from the epitaxial layer in the epitaxial substrate structure, and a carrier substrate to which the light-emitting epitaxial structure is fixed.

The LED device according to another embodiment of this disclosure includes the above epitaxial substrate structure with a starting substrate, and a light emitting epitaxial structure formed from the epitaxial layer in the epitaxial substrate structure.

In order to make the aforementioned and other objects, features and advantages of this disclosure comprehensible, some embodiments accompanied with figures are described in detail below.

BRIEF DESCRIPTION OF THE DRAWINGS

FIGS. 2A, 2B, 2C, 2D, 2E, 2F, 2G and 2H illustrate, in a cross-sectional view, a method of fabricating a substrate structure and an epitaxial substrate structure according to an embodiment of this invention, wherein FIG. 2F also shows the substrate structure and FIG. 2H also shows the epitaxial substrate structure.

FIG. 2A' illustrates an alternative of the step illustrated by FIG. 2A.

FIGS. 2B' and 2B" illustrate two alternatives of the step illustrated by FIG. 2B.

FIG. 2E' illustrates an alternative of the step illustrated by FIG. 2E.

FIG. 2F' illustrates the result of the next step of the step illustrated by FIG. 2E' as well as the substrate structure according to another embodiment of this disclosure.

FIGS. 2B-1 and 2B-2 illustrate exemplary top-view structures of the crystal piers formed in the step illustrated in FIGS. 2B, 2B' and 2B".

DESCRIPTION OF EMBODIMENTS

Figure 1A:
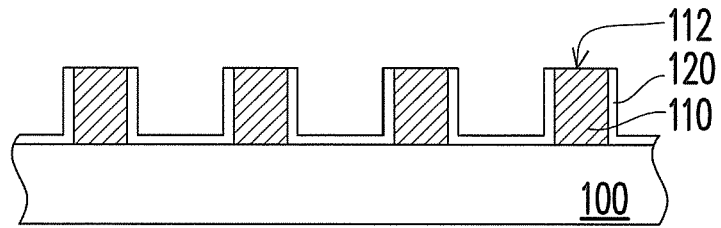
FIGS. 1A and 1B/B' illustrate a method of fabricating a nitride semiconductor substrate in the prior art.

This disclosure is further explained with the following embodiments, which are not intended to limit the scope of this disclosure.

FIGS. 2A, 2B, 2C, 2D, 2E, 2F, 2G and 2H illustrate, in a cross-sectional view, a method of fabricating a substrate structure and an epitaxial substrate structure according to an embodiment of this invention.

Referring to FIG. 2A, a starting substrate 200 is provided, possibly having a planar surface as illustrated. Alternatively, a starting substrate 200' having a plurality of protruding portions 200a is provided, as shown in FIG. 2A'. Each of the protruding portions 200a may have a block shape or a linear shape in a top view, similar to the case of the crystal piers (210, 210' or 210") illustrated in FIG. 2B-1 or 2B-2. In addition, the protruding portions 200a may be arranged regularly or irregularly in the top view.

Referring to FIG. 2A', the height $H_p$ of each protruding portion 200a relative to the surfaces of the non-protruding portions of the substrate 200' may not exceed 100 µm. The angle between the sidewall of a protruding portion 200a and the bottom of the same may range from 45° to 135°. When the protruding portion 200a has a block shape in the top view, the diameter thereof may range from 50 nm to 20 µm, and the block shape may be a circular shape, a square shape or a polygonal shape.

The starting substrate 200 may have a material different from that of the epitaxial layer formed later, i.e., may be a hetero-substrate. For example, as the epitaxial layer includes a nitride semiconductor material, the starting substrate 200 may include silicon, silicon carbide (SiC), sapphire, an arsenide compound like GaAs, or a phosphorous compound like GaP. The starting substrate 200 may alternatively have a material the same as that of the epitaxial layer. That is, the starting substrate 200 may include GaN, AlN, InN, AlGaN, AlInN or AlGaInN as the nitride semiconductor material of the epitaxial layer, thus being a homo-substrate.

Referring to FIG. 2B, a plurality of crystal piers 210 is formed over the starting substrate 200 with a planar surface. When the starting substrate 200' with protruding portions 200a as shown in FIG. 2A' is used alternatively, the crystal piers 210' may be formed on the protruding portions 200a, as shown in FIG. 2B'.

Referring to FIGS. 2B and 2B', the crystal piers 210 or 210' may be formed by forming an epitaxial film on the starting substrate 200 or 200' and patterning the same. The etching for patterning the epitaxial film may not be conducted down to the bottom of the same to completely divide the same, as shown in FIG. 2B", where the crystal piers 210" are connected by the recessed epitaxial film 210s on the starting substrate 200.

Figure 1B:
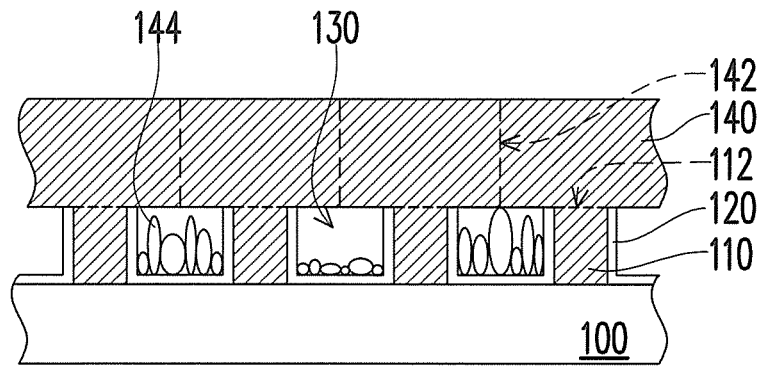
Figure 1B:
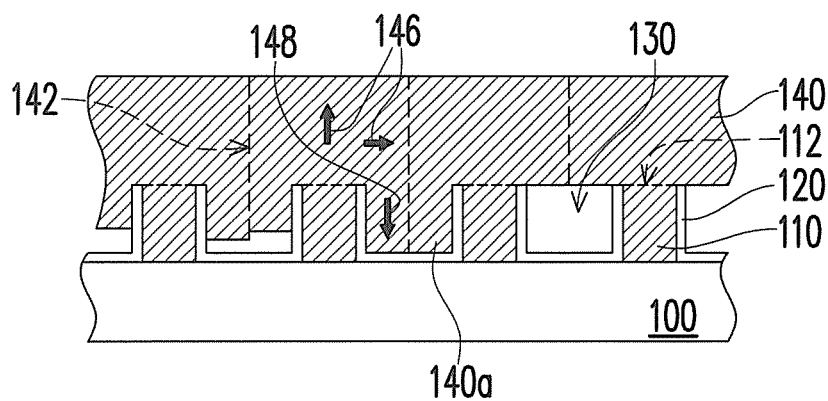

Each crystal pier 210, 210' or 210" may have a block shape or a linear shape in a top view, as shown in FIGS. 2B-1 and 2B-2. The crystal piers 210, 210' or 210" may be arranged regularly in the top view as illustrated, or be arranged irregularly.

The height H of each crystal pier 210 (FIG. 2B) relative to the surface of the starting substrate 200, the height H' of each crystal pier 210' (FIG. 2B') relative to the top of the underlying protruding portion 200a of the starting substrate 200', or the height H" of each crystal pier 210" (FIG. 2B") relative to the top of the recessed epitaxial film 210s, may range from 1 µm to 10 µm, preferably 2 µm to 5 µm. The angle between the sidewall of a crystal pier 210, 210' or 210" and the bottom of the same may range from 45° to 135°, preferably 90° to 105°. The distance between neighboring crystal piers 210, 210' or 210" may range from 50 nm to 20 µm, preferably 100 nm to 5 µm. When each crystal pier 210, 210' or 210" has a block shape in the top view, the diameter thereof may range from 50 nm to 20 µm, preferably 100 nm to 5 µm, and its top-view shape may be a circular shape, a square shape or a polygonal shape.

The material of the crystal piers 210, 210' or 210" is the same as the epitaxial layer to be formed thereon, possibly being a nitride semiconductor material like GaN, AlN, InN, AlGaN, AlInN or AlGaInN. In addition, the crystal piers 210, 210' or 210" may be doped or undoped.

The following steps are described based on the resulting structure in FIG. 2B. However, one of ordinary skill in the art should understand that the same steps can also be readily applied to the resulting structure in FIG. 2B' or 2B".

Referring to FIG. 2C, a sacrificial layer 220 is formed over the starting substrate 200 covering the crystal piers 210, possibly including a positive photoresist material or a negative photoresist material. When including a photoresist material, for example, the sacrificial layer 220 may be formed using a spin-on method.

Referring to FIG. 2D, a portion of the sacrificial layer 220 is removed so that the remaining sacrificial layer 220a exposes an upper portion of the sidewall of each crystal pier 210, wherein the removal may utilize dry etching-back. The height of the exposed upper portion of the sidewall of each crystal pier 210 relative to the top surface of the remaining sacrificial layer 220a may range from about 1 µm to about 10 µm.

A substantially conformal pre-mask layer 230 is then formed on the crystal piers 210 and the remaining sacrificial layer 220a. The pre-mask layer 230 may include a dielectric material, or a refractory metallic material, that can mask the epitaxial growth in the epitaxy process performed later. Examples of the dielectric material include silicon nitride, silicon oxide and spin-on glass (SOG), etc. Examples of the refractory metallic include platinum (Pt), palladium (Pd), tungsten (W) and molybdenum (Mo) as refractory metals, and alloys of the refractory metals. The thickness of the pre-mask layer 230 may range from 0.1 µm to 2 µm, preferably from 0.5 µm to 1 µm.

Thereafter, another sacrificial layer 240 is formed over the starting substrate 200 covering the pre-mask layer 230, possibly including a positive photoresist material or a negative photoresist material. When including a photoresist material, for example, the sacrificial layer 240 may be formed using a spin-on method.

Figure 2E:
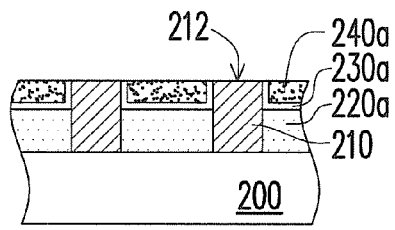
Figure 2E:
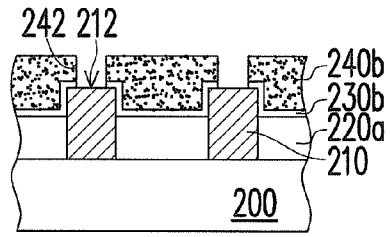

Referring to FIG. 2E, a portion of the sacrificial layer 240 and the portions of the pre-mask layer 230 above the crystal piers 210 are removed to expose the top surface 212 of each crystal pier 210 an form a mask layer 230a. The removal may utilize dry etching-back. The remaining sacrificial layer 240a is between the crystal piers 210.

Alternatively, the portions of the pre-mask layer 230 above the crystal piers 210 are partially or entirely removed with lithography and etching. As shown in FIG. 2E', the sacrificial layer 240 as a photoresist layer is define using a lithography process to form a patterned photoresist layer 240b with openings 242 therein, where each opening 242 exposes at least a portion of the pre-mask layer 230 above the corresponding crystal pier 210. The pre-mask layer 230 is then etched using the patterned photoresist layer 240b as a mask to form a mask layer 230, which exposes at least a portion of the top surface 212 of each crystal pier 210 for epitaxial growth in the later epitaxy process.

Figure 2F:
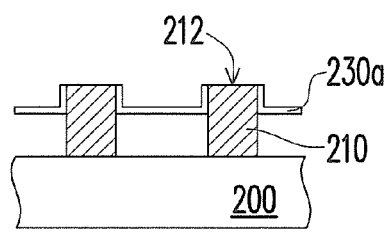
Figure 2F:
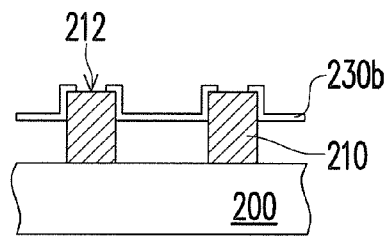

Referring to FIG. 2F/2F', the remaining sacrificial layer 220a and the remaining sacrificial layer 240a/240b are removed. When the sacrificial layers 220 and 240 both include a photoresist film, the removal may utilize a solvent, such as stripper, acetone or dilute sulfuric acid.

FIGS. 2F and 2F' also show two exemplary substrate structures according to an embodiment of this disclosure. As shown in FIG. 2F, the first exemplary substrate structure includes a starting substrate 200, a plurality of crystal piers 210 disposed over the starting substrate 200, and a mask layer 230a that covers an upper portion of the sidewall of each crystal pier 210, is connected between the crystal piers 210 at its bottom, and is separated from the starting substrate 200 by an empty space between the crystal piers 210. The second exemplary substrate structure is different from the first one in that the mask layer 230b also covers a portion of the top surface 212 of each crystal pier 210, as shown in FIG. 2F'.

It is noted that the smaller the exposed portion of the top surface 212 of each crystal pier 210, the more time the coalescence of crystal grains requires in the epitaxy process performed later. In other words, in cases where the mask layer 230b is defined to also cover a portion of the top surface 212 of each crystal pier 210 as shown in FIG. 2F', the coalescence time can be controlled by adjusting the patterning process to adjust the area of the exposed portion of the top surface 212 of each crystal pier 210.

In each of the substrate structures shown in FIGS. 2F and 2F', the height of the lower portion of the sidewall of each crystal pier 210 not covered by the mask layer 230a/230b may range from 1 μm to 9 μm, preferably from 2 μm to 5 μm.

The subsequent steps for making an epitaxial substrate structure are described based on the substrate structure illustrated by FIG. 2F. However, one of ordinary skill in the art should understand that the same steps can also be applied to the substrate structure illustrated by FIG. 2F', mainly with the difference in the coalescence time.

Figure 2G:
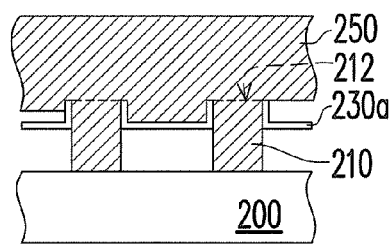

Referring to FIG. 2G, an epitaxy process is performed to form an epitaxial layer 250 of the same material from the crystal pier 210, possibly utilizing HVPE or MOCVD. For example, when an epitaxial layer 250 including GaN is to be formed with HVPE, it is possible that the reactants include $NH_3$ HCl and Ga-metal, the pressure ranges from 150 mbar to 950 mbar, and the temperature ranges from 900° C. to 1070° C. The thickness of the epitaxial layer 250 may range from 30 μm to 2 mm. As a result, an epitaxial substrate structure according to an embodiment of this invention is obtained.

Figure 2H:
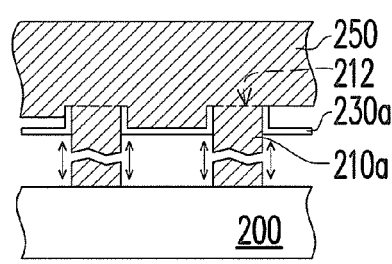

Moreover, the ratio of the width of each crystal pier 210 to the distance between two neighboring crystal piers 210 can be adjusted in advance, so that the crystal piers 210 are broken in the cooling process after the high-temperature epitaxy growth due to the large difference between the thermal expansion coefficients of the different materials of the starting substrate 200 and the crystal piers 210, as shown in FIG. 2H. In such embodiment, the resulting epitaxial substrate structure has broken crystal piers 210a and does not include a starting substrate.

The epitaxial substrate structure can be fabricated by forming an epitaxial based on the above substrate structure of this disclosure and then breaking the crystal piers that are connected between the starting substrate and the epitaxial layer. Alternatively, the crystal piers are not broken so that the epitaxial substrate structure further includes a starting substrate.

Figure 3:
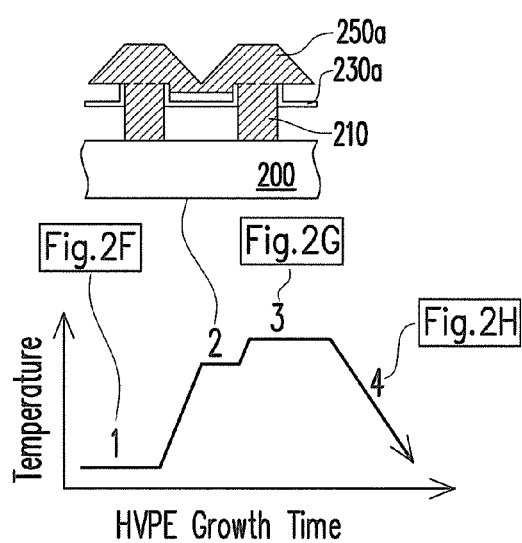
FIG. 3 illustrates the temperature profile in the steps illustrated in FIGS. 2G-2H.

FIG. 3 illustrates the temperature profile in the steps illustrated in FIGS. 2G-2H. The stage 1 is a standby stage at room temperature, wherein the substrate structure is shown in FIG. 2F. The stage 2 is a lateral coalesce stage, wherein crystal grains 250a firstly grow upward from the growing surface 212 of the crystal piers 210 and then grow upward and laterally to coalesce, while the mask layer 230a effectively prevents polycrystalline grain deposition in the gaps between the crystal piers 210 and also prevents downward growth of the crystal grains 250a to the starting substrate 200.

The stage 3 is an upward growth stage at a higher temperature than the stage 2 and corresponds to the step illustrated by FIG. 2G, where the epitaxial layer 250 formed by the coalescence of crystal grains 250a grows upward to be a sufficiently thick film.

The stage 4 is a cooling-separation stage and corresponds to the step illustrated by FIG. 2H, wherein the temperature is lowered constantly and the crystal piers 210 are broken due to the large difference between the thermal expansion coefficients of the different materials of the crystal piers 210 and the starting substrate 200.

Figure 4:
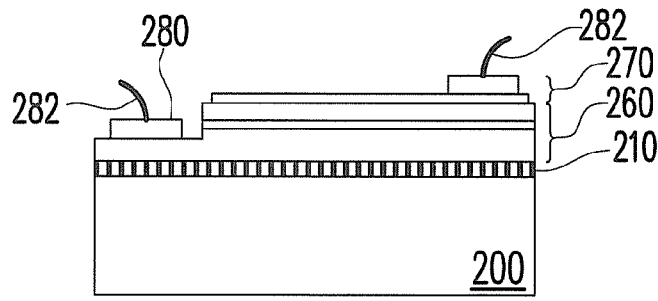
FIGS. 4-6 illustrate three types of LED devices according to some embodiments of this invention.
Figure 5:
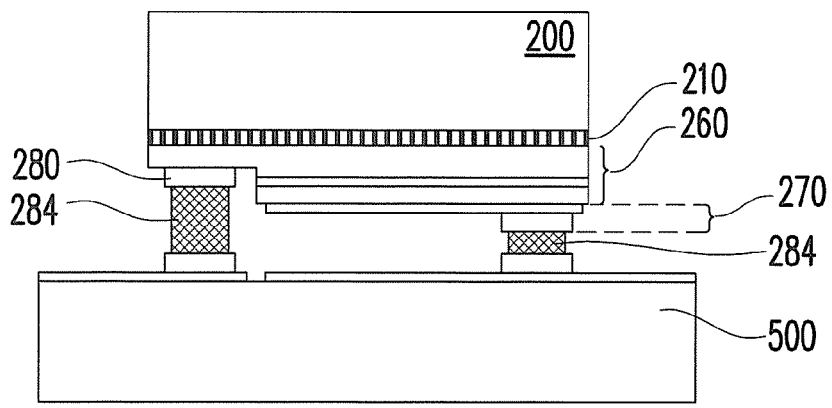
Figure 6:
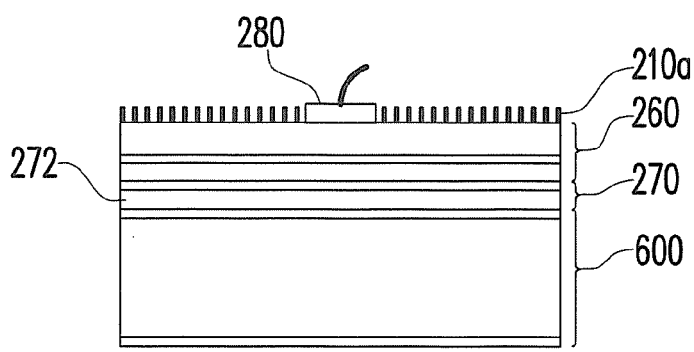

The epitaxial substrate structures as illustrated by FIGS. 2G and 2H both can be used to make LED devices, depending on whether a (transparent) starting substrate is required. FIGS. 4-6 illustrate three types of LED devices made therefrom according to some embodiments of this invention.

Referring to FIG. 4, the LED device includes an epitaxial substrate structure as shown in FIG. 2G, a light-emitting epitaxial structure 260 formed from the epitaxial layer 250 in the epitaxial substrate structure, a first conductivity type electrode layer 270, a second conductivity type electrode layer 280 and bonding wires 282 connected to the electrode layers 270 and 280 respectively. The light-emitting epitaxial structure 260 is formed from the epitaxial layer 250 usually by N-type doping, P-type doping and etching. For such LED structure, it is possible that the first conductivity type electrode layer 270 is a P-type electrode layer connected to the P-type terminal of the light-emitting epitaxial structure 260 and the second conductivity type electrode layer 280 is an N-type electrode layer connected to the N-type terminal of the same.

Referring to FIG. 5, the LED device is different from the above one in that the bonding wires 282 are replaced by metal bumps 284 and a carrier substrate 500 is used. The metal bumps 284 are connected between the carrier substrate 500 and the light-emitting epitaxial structure 260 based on the epitaxial substrate structure as shown in FIG. 2G, so as to form a flip-chip structure.

When the crystal piers 210 in the LED device illustrated by FIG. 4 or 5 are in the nano-scale, the crystal piers 210 and the gaps between them may increase the amount of light from the light-emitting epitaxial structure 260 into the starting substrate 200 when the LED device is electrified to emit light. Thus, the light extraction efficiency (LEE) of the whole LED device is increased.

Referring to FIG. 6, the LED device includes an epitaxial substrate structure as shown in FIG. 2H that does not include a starting substrate and has broken crystal piers, a light-emitting epitaxial structure 260 formed from the epitaxial layer 250 in the epitaxial substrate structure, a first conductivity type electrode layer 270, a second conductivity type electrode layer 280, and a carrier substrate 600. The light emitting epitaxial structure 260 is fixed onto the carrier substrate 600, possibly by a thermally and electrically conductive adhesive 272. For such an LED structure, it is possible that the first conductivity type electrode layer 270 is a P-type electrode layer connected to the P-type terminal of the light-emitting epitaxial structure 260 and the second conductivity type electrode layer 280 is an N-type electrode layer connected to the N-type terminal.

Similar to the case of the LED devices illustrated by FIGS. 4-5, when the broken crystal piers 210a in the LED device illustrated by FIG. 6 are in the nano-scale, the broken crystal piers 210a are also capable of increasing the light extraction efficiency (LEE) of the whole LED device.

In some embodiments, the mask layer is separated from the starting substrate by an empty space between the crystal piers, polycrystalline grains are not easy to grow in the gaps to affect the required epitaxial layer. Moreover, the suspended mask layer prevents the downward epitaxial growth from reaching to the starting substrate between the crystal piers, so that the air-bridge effect of the epitaxial layer is obtained. Further, for the lower portion of the sidewall of each crystal pier is not covered by the mask layer, the crystal piers are easier to break thereat so that an epitaxial substrate without a starting substrate is easier to obtain.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A substrate structure, comprising:
A starting substrate;
An epitaxial layer over the starting substrate;
A plurality of crystal piers, disposed on a bottom surface of the epitaxial layer; and
A mask layer that covers an upper portion of a sidewall of each of the crystal piers, is connected between the crystal piers at its bottom, and is separated from the starting substrate by a first empty space between the crystal piers, and is separated from the epitaxial layer by a second empty space.

2. The substrate structure of claim 1, wherein the crystal piers comprise a nitride semiconductor material.

3. The substrate structure of claim 1, wherein a material of the starting substrate is different from a material of the crystal piers.

4. The substrate structure of claim 1, wherein a material of the starting substrate is the same as a material of the crystal piers.

5. The substrate structure of claim 1, wherein each of the crystal piers has a block shape or a linear shape in a top view.

6. The substrate structure of claim 1, wherein the mask layer further covers a portion of a top surface of each of the crystal piers.

7. The substrate structure of claim 1, wherein a lower portion of the sidewall of each of the crystal piers not covered by the mask layer has a height of 1-9 µm.

8. An epitaxial substrate structure, comprising:
an epitaxial layer;
a plurality of crystal piers, disposed on a bottom surface of the epitaxial layer and having the same material of the epitaxial layer; and
a mask layer, covering an upper portion of a sidewall of each of the crystal piers and a portion of a top surface of each of the crystal piers, and being connected between the crystal piers at its bottom wherein the epitaxial layer and the mask layer are separated by an empty space.

9. The epitaxial substrate structure of claim 8, wherein the epitaxial layer and crystal piers comprise a nitride semiconductor material.

10. The epitaxial substrate structure of claim 8, wherein each of the crystal piers has a block shape or a linear shape in a top view.

11. The epitaxial substrate structure of claim 8, wherein a lower portion of the sidewall of each of the crystal piers not covered by the mask layer has a height of 1-9 µm.

12. The epitaxial substrate structure of claim 8, further comprising a starting substrate to which the crystal piers are connected.

13. A light-emitting diode device, comprising:
the epitaxial substrate structure of claim 12; and
a light emitting epitaxial structure formed from the epitaxial layer in the epitaxial substrate structure.

14. The light-emitting diode device of claim 13, wherein an N-type terminal and a P-type terminal of the light emitting epitaxial structure are connected to bonding wires.

15. The light-emitting diode device of claim 13, wherein an N-type terminal and a P-type terminal of the light emitting epitaxial structure are connected to a carrier substrate via metal bumps to form a flip-chip structure.

16. A light-emitting diode device, comprising:
the epitaxial substrate structure of claim 8;
a light emitting epitaxial structure formed from the epitaxial layer in the epitaxial substrate structure; and
a carrier substrate, onto which the light emitting epitaxial structure is fixed.

17. The light-emitting diode device of claim 16, wherein the light emitting epitaxial structure is fixed onto the carrier substrate by a thermally and electrically conductive adhesive.

* * * * *